(12) United States Patent
Fujimori

(10) Patent No.: US 7,012,460 B2
(45) Date of Patent: *Mar. 14, 2006

(54) IC DEVICE HAVING A TRANSISTOR SWITCH FOR A POWER SUPPLY

(75) Inventor: Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/932,643

(22) Filed: Sep. 1, 2004

(65) Prior Publication Data

US 2005/0030083 A1    Feb. 10, 2005

Related U.S. Application Data

(63) Continuation of application No. 10/269,277, filed on Oct. 11, 2002, now Pat. No. 6,806,758.

(30) Foreign Application Priority Data

Oct. 15, 2001    (JP)    ............................ 2001-316700

(51) Int. Cl.
   *G05F 3/02*    (2006.01)
(52) U.S. Cl. ...................... 327/530; 327/437; 307/130; 307/156

(58) Field of Classification Search ................ 327/365, 327/419, 427, 437, 530; 307/126, 130, 131
See application file for complete search history.

(56) References Cited

U.S. PATENT DOCUMENTS

| | | | |
|---|---|---|---|
| 5,155,573 A | 10/1992 | Abe et al. | 257/304 |
| 6,327,172 B1 | 12/2001 | Ishiwara | 365/145 |
| 2002/0043676 A1 | 4/2002 | Ohtsuka et al. | 257/295 |
| 2003/0094640 A1 | 5/2003 | Ohtsuka et al. | 257/295 |
| 2003/0142533 A1 | 7/2003 | Ueda et al. | 365/145 |

*Primary Examiner*—Terry D. Cunningham
(74) *Attorney, Agent, or Firm*—Hogan & Hartson, LLP

(57) ABSTRACT

An IC device has a MOSFET serving as a power switch, a condenser connected between a first input terminal of the IC and the gate of the MOSFET, and a ferroelectric condenser connected between a second input terminal of the IC and the gate of the MOSFET. A prescribed voltage having a predetermined polarity is applied across the first and the second input terminals to generate a remanent polarization oriented in a specific direction in the ferroelectric condenser, thereby raising the threshold voltage of the MOSFET to a higher level than its original level. The power switching MOSFET is fabricated in the same manufacturing process as for other circuit blocks of the IC device such that it has substantially the same threshold voltage as that of the MOSFETs in other circuit blocks.

6 Claims, 6 Drawing Sheets

IC DEVICE HAVING A TRANSISTOR SWITCH FOR A POWER SUPPLY

This is a continuation of application Ser. No. 10/269,277, filed Oct. 11, 2002, now U.S. Pat. No. 6,806,758 which application is hereby incorporated by reference in its entirety.

FIELD OF THE INVENTION

The invention relates to a semiconductor integrated circuit device (IC device) having a transistor switch for a power supply.

BACKGROUND OF THE INVENTION

Most IC devices generally include numerous transistors such as MOSFET. They are required to have limited power consumption. This is true particularly when they are used in portable electronic devices.

FIG. 1 shows schematically a structure of a typical IC device configured to operate at a reduced power. Block 10 represents a transistor circuit block involving many transistors like CMOSFETs. The IC device as shown in FIG. 1 further includes a power switch consisting of a P-type MOSFET 11 and an N-type MOSFET 12 for turning on and off power to the circuit block 10. They are connected between a power supply having a potential E1 and the ground of potential Egnd. The supply voltage Vcc amounts to the potential difference between the two potentials.

In operation, transistor circuits inside the block 10 are switched at high frequency. In order to reduce power consumption by the circuit block 10, the supply voltage Vcc is set as low as 2 V say. In a transistor circuit, reduction of the supply voltage Vcc is effective in reducing its power consumption, since power consumption is proportional to the square of the supply voltage. However, when the supply voltage is reduced, operational speed of the transistor circuits in the block is also reduced, making an appreciable delay in the device.

One way to circumvent such delay is to reduce the threshold voltage of the transistors (e.g. CMOSFETs) of the circuit block 10 in correspondence with the reduction of the supply voltage Vcc. This reduces only the power consumption without reducing the operational speed of the block 10.

However, with a reduced threshold voltage as mentioned above, leak current through the MOSFETs, and hence the standby power consumption by the MOSFETs, increases while they are turned off. It is obviously necessary to reduce the standby power as much as possible.

To attain this goal, normally a power switch is used which has a P-type MOSFET 11 and an N-type MOSFET 12 both having a high threshold voltage (HIGH Vth). With this switch, the transistor circuits in the block 10 are operated at a high frequency at the low threshold voltage (LOW Vth), but when they are in standby condition, the MOSFETs 11 and 12 are turned off at the high threshold voltage (HIGH Vth), thereby suppressing the leak currents (i.e., the standby power).

In this conventional IC device, the threshold voltage of the MOSFETs such as CMOSs of the circuit block 10 is set to a low level (LOW Vth) while the threshold voltages of the P-type MOSFET 11 and of N-type MOSFET 12 serving as a power switch must be set to a high level. In providing the MOSFETs 11, 12 with a threshold voltage higher than that of other MOSFETs, a special mask is needed to perform extra ion implantation in the process of manufacturing the IC device.

SUMMARY OF THE INVENTION

It is, therefore, an object of the invention to provide MOSFETs serving as a power supplying switch in an IC device in such a way that the MOSFETs can be fabricated in the same manufacturing process as other MOSFETs and their threshold voltages can be raised to reduce leak current through them while they are turned off, thereby reducing power consumption during standby.

In accordance with one aspect of the invention, there is provided an IC device having at least one power supplying transistor, wherein said power supplying transistor is a metal insulator semiconductor field effect transistor (MISFET), said IC device further comprising:

a condenser having one end connected with the gate of said power supplying MISFET; and a ferroelectric condenser having one end connected to the gate of said power supplying MISFET.

In accordance with another aspect of the invention, there is provided an IC device, comprising:

a first power supplying transistor switch circuit that includes a power supplying P-type MISFET;

a condenser having one end connected to the gate of said power supplying P-type MISFET, a ferroelectric condenser having one end connected to the gate of said power supplying P-type MISFET;

a transistor circuit block that includes MISFETs;

a second power supplying transistor switch circuit including a power supplying N-type MISFET, a condenser having one end connected to the gate of said power supplying N-type MISFET, and a ferroelectric condenser having one end connected to the gate of said power supplying N-type MISFET, wherein said first power supplying transistor switch circuit, transistor circuit block, and second power supplying transistor switch circuit are connected in series in the order mentioned.

In accordance with further aspect of the invention, there is provided a method of controlling a power supplying transistor switch circuit, wherein said transistor switch circuit has a power supplying MISFET, a condenser having one end connected to the gate of said MISFET, a ferroelectric condenser having one end connected to the gate of said MISFET, said method comprising steps of:

temporarily applying, in a prescribed direction, a voltage across the other end of said condenser and the other end of said ferroelectric condenser;

generating a remanent polarization in a prescribed direction in said ferroelectric condenser, thereby impressing said MISFET with a threshold voltage higher than the threshold voltage of said power supplying MISFET itself; and applying a control voltage to the other end of said condenser to turn ON/OFF said power supplying MISFET.

BRIEF DESCRIPTION OF THE DRAWINGS

The invention will now be described in detail by way of example with reference to accompanying drawings, in which.

DETAILED DESCRIPTION OF THE PREFERRED EMBODIMENT

Figure 1:
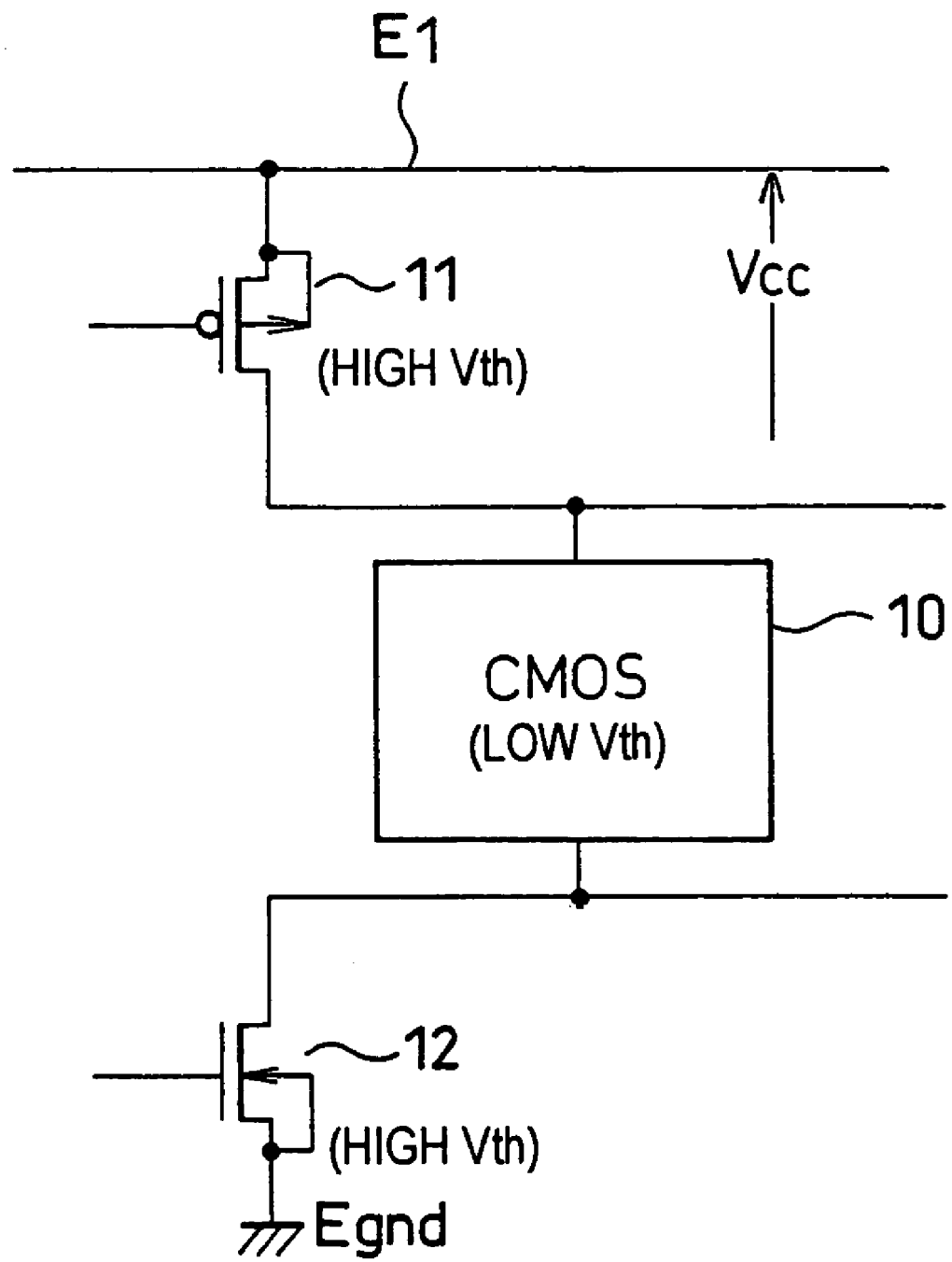
FIG. 1 is a circuit diagram of a conventional IC device.
Figure 2:
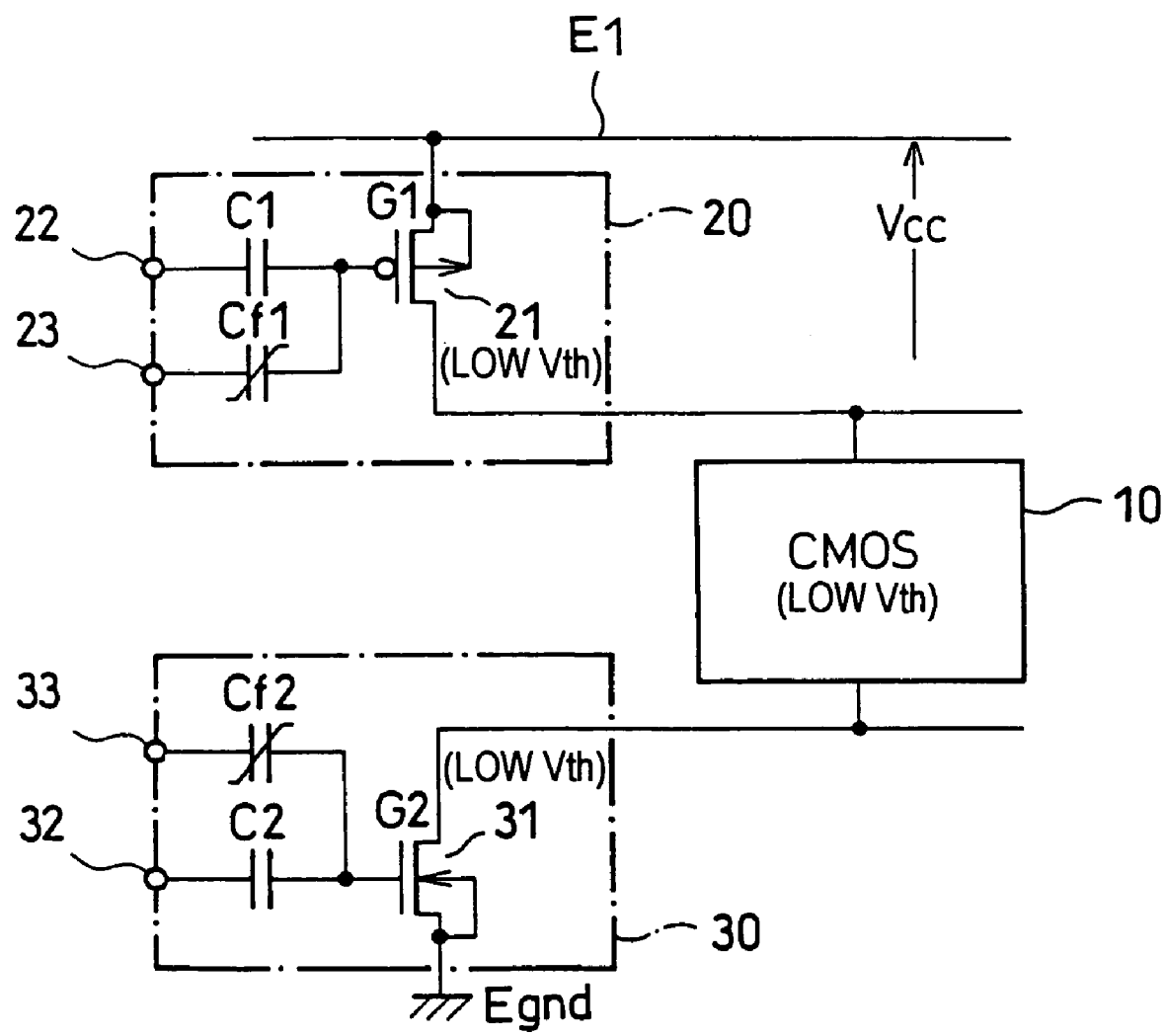
FIG. 2 is a circuit diagram of an IC device according to the invention.

Referring to FIG. 2, there is shown a circuit diagram of an IC device according to the invention. In what follows the invention will be described with reference to a preferred embodiment of an IC device which comprises MOSFETs as MISFETs.

As shown in FIG. 2, in order to minimize power consumption, a transistor circuit block 10 is formed of a multiplicity of CMOSFETs, operable at a low supply voltage Vcc of, for example, 1–2 Volts, given by the difference in potential of a first power supply of potential E1 and the ground of potential Egnd.

In order to circumvent operational delay of the transistor circuit on account of the supply voltage Vcc being low, the threshold voltage of the internal MOSFETs of the circuit block 10 is set to a low level (referred to as LOW Vth). Thus, the operating speed of the circuit block 10 can be fast even though the supply voltage Vcc is low.

A power supplying transistor switch circuit 20 is connected between the power supply of potential E1 and the circuit block 10. Another power supplying transistor switch circuit 30 is connected between the circuit block 10 and the ground of potential Egnd. Power is supplied to the circuit block 10 and cut off by turning ON and OFF the transistor switch circuits 20 and 30.

The power supplying transistor switch circuit 20 has a P-type MOSFET 21 whose gate G1 is coupled to first and second input terminals 22 and 23, respectively, via a condenser C1 and a ferroelectric condenser Cf1, respectively. Similarly, the power supplying transistor switch circuit 30 has an N-type MOSFET 31 whose gate G2 is connected to first and second input terminals 32 and 33 via a condenser C2 and a ferroelectric condenser Cf2, respectively. Here, condensers (C1 and C2) other than ferroelectric condensers (Cf1 and Cf2) are simply referred to condensers.

In the example shown above, condensers C1 and C2 and ferroelectric condensers Cf1 and Cf2 are connected to the respective first and second input terminals. It should be understood, however, that the input terminals are shown for convenience in that the condensers may be connected directly to other elements in the IC device without the terminals.

The P-type MOSFET 21 and the N-type MOSFET 31 are fabricated together with other MOSFETs in the circuit block 10, so that their threshold voltages are set to the low level (LOW Vth).

In using the IC device shown in FIG. 2 for the first time, the power supplying transistor switch circuits 20 and 30 are first initialized.

Figure 3:
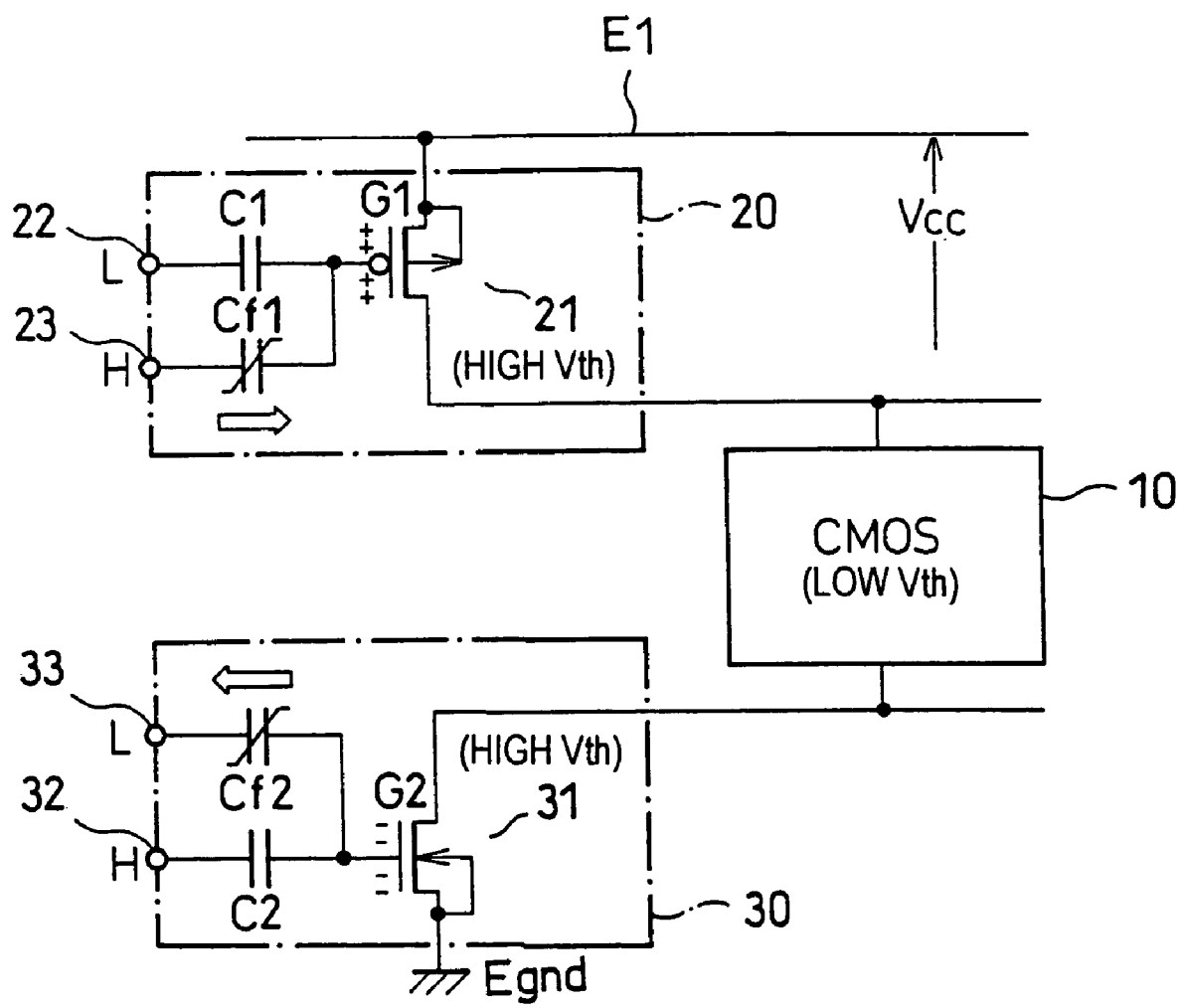
FIG. 3 is a circuit diagram illustrating a method of initializing the transistor switch circuit shown in FIG. 2.

The initialization is carried out by applying to the second input terminal 23 a high potential (referred to as HIGH level potential), e.g. the potential E1, while a low potential (referred to as LOW level potential), e.g. the ground potential Egnd, is applied to the first input terminal 22, as shown in FIG. 3. Because the ferroelectric condenser Cf1 has a polarization hysteresis, it will have a remanent polarization oriented in a specific direction after the removal of the voltage applied thereto.

In the example shown, the second input terminal 23 is applied with HIGH level voltage and the first input terminal 22 with LOW level voltage. Consequently, polarization will occur in the condenser Cf1 in the direction as indicated by an arrow shown in FIG. 3, creating a positive charge on the gate G1 of the P-type MOSFET 21 connected to the node of the condensers C1 and Cf1. Due to the remanent polarization in the ferroelectric condenser, a certain amount of the positive charge will remain on the gate G1 even after the removal of the voltages from the first and the second input terminals 22 and 23, respectively.

In the ferroelectric condenser Cf2, polarization will occur in the direction indicated by an arrow as shown under the HIGH level potential applied to the first input terminal 32 and the LOW level potential to the second input terminal 33, creating a negative charge on the gate G2 of the N-type MOSFET 31 connected to the node of the condensers C2 and Cf2. The negative charge will partly remain on the gate G2 as a result of remanent polarization in the condenser Cf2 even after the removal of applied potentials from the respective input terminals 32 and 33.

Consequently, after the initialization, the remanent polarizations in the ferroelectric condensers Cf1 and Cf2 are conserved, the second input terminals 23 and 33 of the respective power supplying transistor switch circuit 20 and 30 may be left open.

Under this condition, the gate G1 of the P-type MOSFET 21 is positively charged, while the gate G2 of the N-type MOSFET 31 is negatively charged, so that the threshold voltages of the respective MOSFETs are held at the HIGH level.

Figure 4:
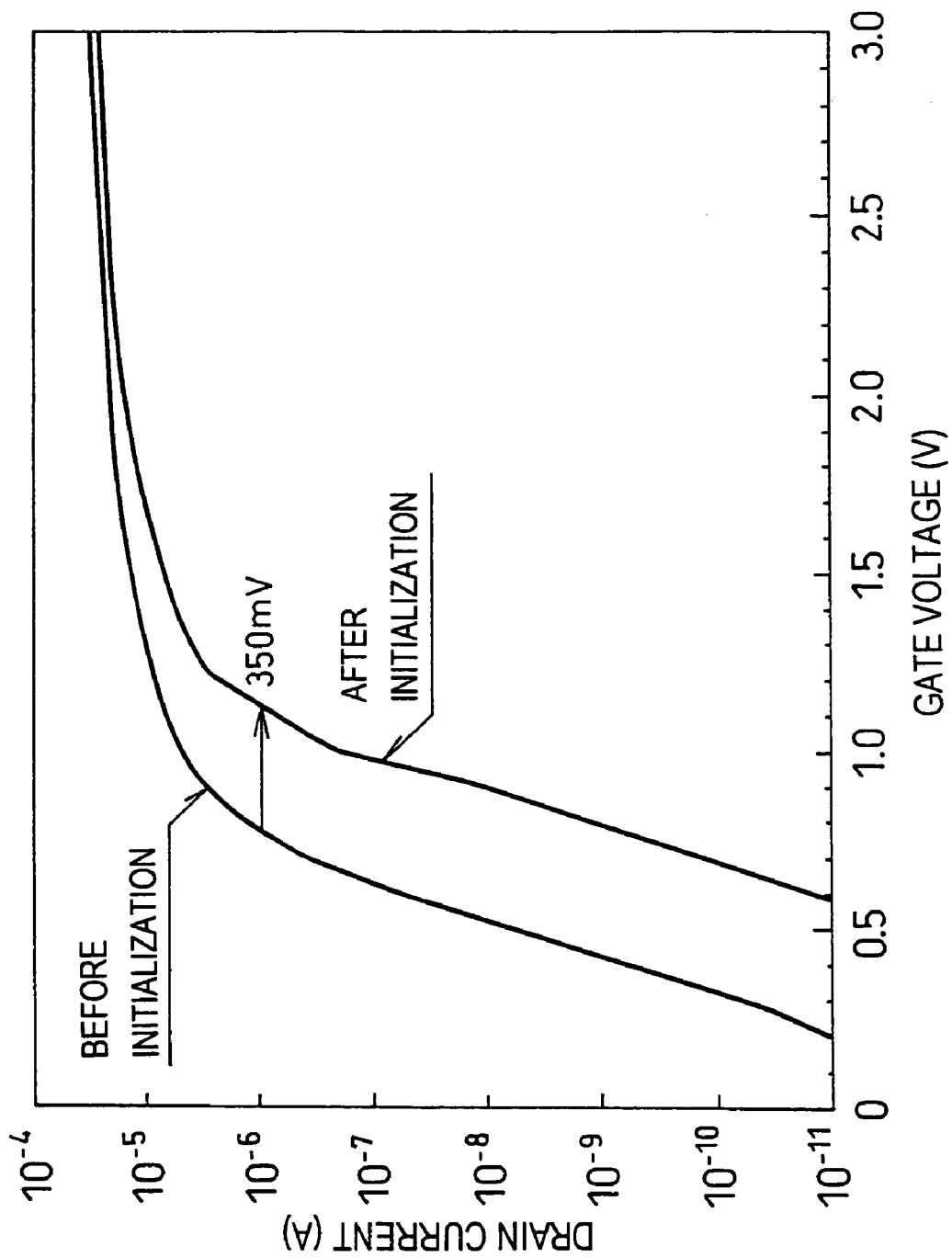
FIG. 4 is a diagram representation of gate voltage versus drain current characteristic of the transistor switch circuit shown in FIG. 2.

FIG. 4 is a graph showing the experimental gate voltage-drain current characteristic of an N-type power supplying transistor switch circuit according to the invention. This is the characteristic of the N-type MOSFET switch circuit 30 shown in FIGS. 2 and 3.

FIG. 4 compares the characteristic before initialization, that is, that of the N-type MOSFET itself, with the characteristic after the initialization, that is that of N-type MOSFET with its gate charged with a negative charge. From this comparison, it is seen clearly in the Figure that the characteristic curve is shifted in the direction of increasing gate voltage by the initialization. In the example shown herein, the shift amounts to about 350 mV.

Thus, that the gate voltage-drain current characteristic of a transistor switch circuit is shifted implies that the threshold voltage Vth is raised by about 350 mV.

The same is true in the P-type MOSFET. As a result, by connecting the power supplying transistor switch circuit 20 and power supplying transistor switch circuit 30 in series, the combined threshold voltage of the switch circuits 20 and 30 is further raised. Therefore, the leakage current is suppressed efficiently.

Figure 5:
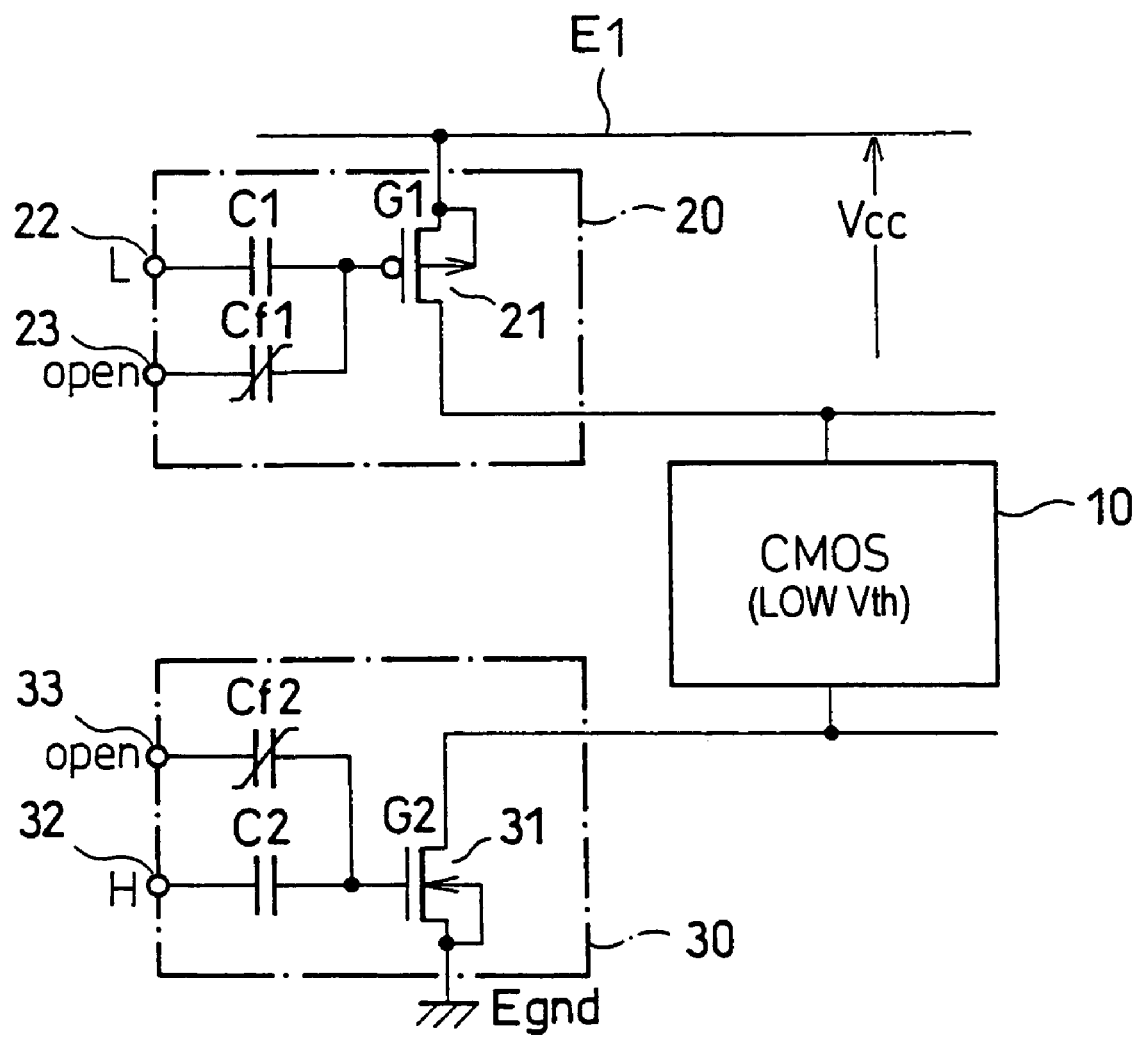
FIG. 5 is a graphical representation of a first operational state of the IC device shown in FIG. 2.
Figure 6:
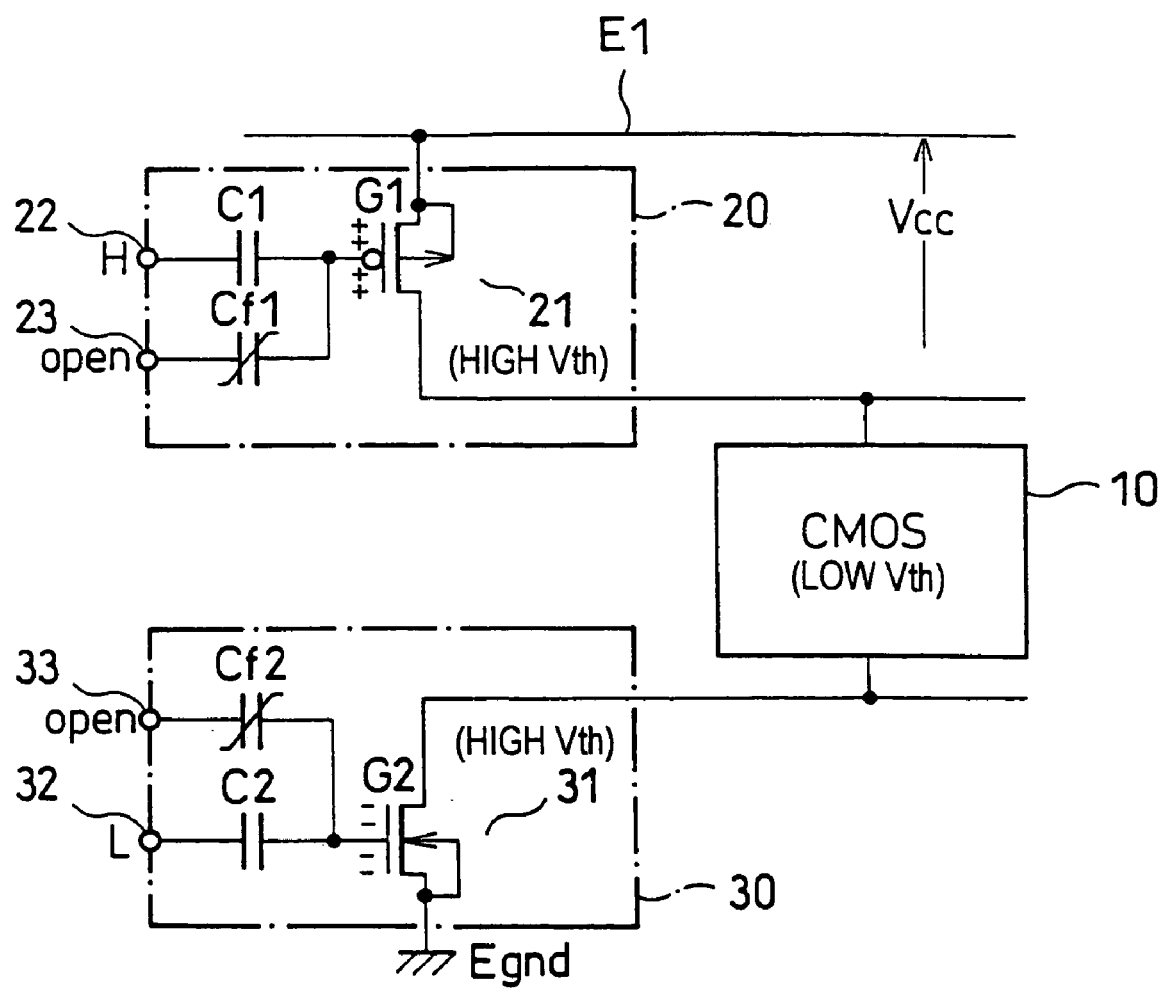
FIG. 6 is a graphical representation of a second operational state of the IC device shown in FIG. 2.

After the power supplying transistor switch circuit 20 and power supplying transistor switch circuit 30 are initialized, to place the IC device in operation, the first input terminal 22 is impressed with the LOW level potential, while the first input terminal 32 with HIGH level potential, as shown in FIG. 5. While the input terminal is impressed with LOW level potential, the charge on the gate G1 is absorbed by the condenser C1, lowering the gate G1 to a sufficiently LOW potential, thereby fully turning ON the P-type MOSFET 21. While the input terminal is impressed with the HIGH level potential, the charge on the gate G2 is absorbed by the condenser C2, raising the gate G2 to a sufficiently HIGH potential, thereby fully turning ON the N-type MOSFET 31.

The ON-voltage, i.e. voltage drop across the conducive P-type MOSFET 21 and N-type MOSFET 31, is very small, irrespective of the magnitude of the threshold voltage. Hence, the circuit block 10 is supplied with a voltage which is substantially the supply voltage Vcc, allowing the circuit block 10 to operate without any hindrance even under the LOW level voltage.

On the other hand, when the IC device is on standby, the first input terminal 22 is supplied with the HIGH potential and the first input terminal 32 with the LOW potential.

In this case, the gate G1 restores from the condenser C1 the positive charge, bringing the threshold voltage of the P-type MOSFET 21 back to HIGH Vth again. Similarly, the gate G2 restores the negative charge from the condenser C2, bringing the threshold voltage of the N-type MOSFET 31 back to HIGH Vth again.

As a result of the HIGH potential applied to the first input terminal 22 and LOW potential to the first input terminal 32, the P-type MOSFET 21 and the N-type MOSFET 31 are turned OFF. Since the threshold voltages of these MOSFETs are high, only a suppressed leak current results.

After the initialization, the positive charge on the gate G1 of the P-type MOSFET 21 and the negative charge on the gate G2 of the N-type MOSFET 31 are conserved, so that they can reproduce the same conductive state and standby state in repetition.

Thus, the leak current through the P-type MOSFET 21 and the N-type MOSFET 31, and hence the standby power consumption by the IC device, is suppressed to a very low level if the internal transistors of the circuit block 10 have low threshold voltage (LOW Vth).

Although the invention has been described with particular reference to a preferred embodiment in which two transistor switch circuits 20 and 30 are used in the above embodiment, the supply voltage may be implemented to the circuit block 10 using only one of them. It will be understood that the power supplying transistor switch circuits 20 and 30 may be provided in pairs to each of such transistor circuit block 10.

The invention requires provision of condensers C1 and C2 and ferroelectric condensers Cf1 and Cf2, which can be implemented by an ordinary technique well known in the art. Ferroelectric condensers may be substituted for by ferroelectric elements for use in ferroelectric memory, or may be independently formed.

What we claim is:

1. A semiconductor integrated circuit device (IC device) comprising:
    a circuit block having a transistor circuit supplied with a potential difference between a power supply potential and a ground potential; and
    a switch circuit for switching on and off the supplying of a power supply of potential or ground of potential to said circuit block; said switch circuit including:
    a power switching transistor which is an insulated gate FET (field effect transistor),
    a nonferroelectric condenser having one end connected to the gate of said power switching transistor, and
    a ferroelectric condenser having one end connected to the gate of said power switching transistor.

2. The IC device according to claim 1, wherein said power switching transistor is a MISFET (metal insulator semiconductor field effect transistor), and the transistors of said circuit block are MISFETs.

3. The IC device according to claim 1, wherein said power switching transistor is a an MOSFET (metal-oxide-semiconductor field effect transistor), and the transistors of said circuit block are MOSFETs.

4. The IC device according to claim 1, wherein said transistor circuit of said circuit block includes CMOS (complementary MOS) FETs, each of said CMOSFETs formed of a P-type MOSFET and an N-type MOSFET.

5. The IC device according to claim 1, wherein said power switching transistor and the transistors of said circuit block are fabricated in the same manufacturing process.

6. The IC device according to claim 1, wherein said power switching transistor and the transistors of said circuit block have substantially the same threshold voltage.

* * * * *